United States Patent
Doré et al.

(10) Patent No.: US 9,774,106 B2
(45) Date of Patent: Sep. 26, 2017

(54) GROUNDING SYSTEM

(71) Applicant: ABB Schweiz AG, Baden (CH)

(72) Inventors: Erik Doré, Ludvika (SE); Björn Sandin, Ludvika (SE); Olle Ekwall, Ludvika (SE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/308,142

(22) PCT Filed: May 14, 2014

(86) PCT No.: PCT/EP2014/059872
§ 371 (c)(1),
(2) Date: Nov. 1, 2016

(87) PCT Pub. No.: WO2015/172827
PCT Pub. Date: Nov. 19, 2015

(65) Prior Publication Data
US 2017/0054229 A1 Feb. 23, 2017

(51) Int. Cl.
*H01R 4/66* (2006.01)
*H02J 3/00* (2006.01)
(Continued)

(52) U.S. Cl.
CPC .................. *H01R 4/66* (2013.01); *H02J 3/00* (2013.01); *H05F 3/02* (2013.01); *H01H 31/003* (2013.01);
(Continued)

(58) Field of Classification Search
None
See application file for complete search history.

(56) References Cited

U.S. PATENT DOCUMENTS 4,202,591 A * 5/1980 Borgstrom ............. H01R 13/53
218/156

FOREIGN PATENT DOCUMENTS

JP  S5615631 U  11/1981
JP  H034439 U  1/1991
(Continued)

OTHER PUBLICATIONS

International Preliminary Report of Patentability Application No. PCT/EP2014/059872 Mailing Date: Oct. 10, 2016 5 Pages.
(Continued)

*Primary Examiner* — Dimary Lopez Cruz
(74) *Attorney, Agent, or Firm* — Whitmyer IP Group LLC (57) ABSTRACT

A remotely controllable grounding system including at least one movable rod element having at least one conductive and isolating sections and at least one conductor configured to be electrically connected to ground and the movable rod element. The grounding system including at least one pair of positive and negative grounding terminals arranged to be fixedly connected to electric equipment to be grounded. The grounding system includes a rod propulsion system arranged to be remotely controlled and configured to move the at least one movable rod element from an ungrounded position (U), in which the positive and negative grounding terminals are isolated from one another by the isolating section, into a grounded position (G), in which the positive and negative grounding terminals are galvanically connected with one another by the conductive section and in which grounded position the conductive section is connected to ground via the at least one conductor.

19 Claims, 5 Drawing Sheets

(51) Int. Cl.
  *H05F 3/02*    (2006.01)
  *H01H 31/00*   (2006.01)
  *H02M 7/483*   (2007.01)

(52) U.S. Cl.
  CPC ..... *H01L 2924/0002* (2013.01); *H02M 7/483* (2013.01)

(56) References Cited

FOREIGN PATENT DOCUMENTS

| | | |
|---|---|---|
| JP | H06165494 A | 6/1994 |
| JP | H06343267 A | 12/1994 |
| JP | H07335821 A | 12/1995 |
| JP | 2002008943 A | 1/2002 |
| KR | 101288679 B1 | 7/2013 |

OTHER PUBLICATIONS

International Search Report and Written Opinion of the International Searching Authority Application No. PCT/EP2014/059872 Completed: Aug. 22, 2014; Mailing Date: Sep. 2, 2014 8 pages.
Written Opinion of the International Preliminary Examination Authority Application No. PCT/EP2014/059872 Mailing Date: Jul. 26, 2016 5 Pages.
Japanese Office Action, Application No. 2016-567565, dated Jul. 11, 2017, 4 pages.

* cited by examiner

GROUNDING SYSTEM

TECHNICAL FIELD

The invention relates to a grounding system that is configured to be controlled from a remote location.

BACKGROUND

Currently high voltage equipment, especially high voltage equipment in valve halls, such as valves of current converters may require regular maintenance and/or alteration. When the valve is energized no personnel is allowed to be in the valve hall due to risk of injury. For some purposes, such as maintenance, the valves need to be deenergized to allow personnel to enter the valve hall. In case personnel has to enter the valve hall, the valves need to be connected to ground to avoid electric discharges from the valves, such as surge current strokes or corona discharges originating from residual capacitor charges or static charge in the insulating material, which may harm the personnel present in the valve hall.

It is known to provide grounding of the valves when the valve hall is open and accessible for maintenance personnel and people in general, thus when the valves are deenergized. The grounding is used to ensure that residual charges in the system or arrangement, for example from the capacitors, are discharged. For such grounding purposes an operator has to enter the valve hall and manually install a grounding contact. Such a grounding contact must first be moved to the right place, then connected to a plug or socket in the valve hall floor and then extended to establish electric contact with the valve. These steps have to be taken by an operator whom is comparably close to the actual grounding contact or whom is at least in the valve hall, since the grounding contact has to be manually moved in the right position, connected to the plug and extended to electrically connect to the valve. The operator is thus exposed to the risk of contacting the two terminals of a capacitor, when the capacitor is still charged and this may be very harmful for the operator. In addition remaining charges in the capacitors may result in spontaneous discharges during these steps, which may cause deadly injuries. In addition, such a grounding operation involves a plurality of manual steps, which raises potential risk of failures or mistakes. Further, the above described manual steps are time consuming and thus costly.

In particular the application of a manual grounding process and thus of a manual grounding system in modular multilevel voltage source converter system comprising a plurality of cells is difficult, cumbersome and involves time consuming work.

Prior art grounding systems do not provide a possibility to ground a valve automatically or electrically control or check the grounding of the valves when the grounding system is in place, prior to the personnel entering the valve hall. In known systems there is thus always a remaining risk that a whole valve or a valve cell is not correctly connected to ground and that electric charges remain somewhere in the system.

SUMMARY

It is an object of the invention to provide a grounding system that is safe, convenient, efficient and reliable.

The invention relates to a grounding system comprising a moveable rod element with a plurality of conductive sections and a plurality of isolating sections. The conductive sections and isolating sections are used to interact with a plurality of pairs of positive and negative ground terminals of electric equipment. By choosing the length of the conductive sections and isolating sections depending on distances between positive and negative ground terminals of a pair and distances between the pairs of positive and negative ground terminals is it possible to position the moveable rod element so that the positive and negative ground terminals are either electrically separated when the electric equipment is in use or electrically interconnected for grounding when the electric equipment is not in use. The moveable rod element is arranged to be remotely controlled so that the electric equipment can be grounded from a safe distance, for example via a control device. Due to the plurality of conductive sections and isolating sections on the moveable rod element it is possible to ground a plurality of pairs of positive and negative ground terminals in one single operation. The grounding system is thus suitable for modular multilevel voltage source converter systems comprising a plurality of cells. The moveable rod element is preferably driven or propelled by a propulsion system, for example via a pneumatic or hydraulic system. A pipe arrangement may interconnect pistons, which are configured to drive the moveable rod element, with a control device.

Disclosed herein is a grounding system configured to be remotely controlled comprising at least one movable rod element having at least one conductive section and at least one isolating section. The grounding system comprises further at least one conductor, which is configured to be electrically connected to ground and the movable rod element and at least one pair of positive and negative ground terminals arranged to be fixedly connected to electric equipment to be grounded. The grounding system further comprises a rod propulsion system arranged to be remotely controlled and configured to move the at least one movable rod element from an ungrounded position, in which the positive and negative grounding terminals are isolated from one another by the isolating section, into a grounded position, in which the positive and negative grounding terminals are galvanically connected with one another by the conductive section and in which grounded position the conductive section is connected to ground via the at least one conductor.

The rod propulsion system may thus advantageously be activated and controlled from a remote location via the control device without exposing personnel to dangers as discussed with reference to the prior art.

A number of different mechanisms for moving the rod element can be envisaged, and will be discussed subsequently. For instance, the rod propulsion system may be mechanically and/or electrically coupled, outside the building, which houses the converter system, to a control device located at a safe distance from the high voltage equipment such as the modular multilevel converter system, wherein operation of the control device advantageously will activate the rod propulsion system such that the system causes the rod element to move between a grounded—and an ungrounded position. As an example, an operator wishing to enter the valve hall may have to operate a control device in the form of a switch or a button from the outside of the valve hall causing the rod propulsion system to physically move the rod element from the ungrounded position to the grounded position before the valve hall can be entered.

In a further alternative, the control device is located in a control room of the valve hall and in communication with the rod propulsion system, and activates the rod propulsion system to move the rod element upon operation of a control room operator.

As can be concluded, many different solutions can be envisaged for remotely controlling the rod propulsion system to move the rod element according to the present invention.

Advantageously, the grounding system of the present invention is configured to be used with high voltage electric equipment such as for example modular multilevel voltage source converter systems or the like.

In an embodiment the grounding system may comprise at least first and second control terminals the first control terminal being arranged at one side of the at least one moveable rod element and the second control terminal being arranged on another side of the at least one moveable rod element galvanically or electrically connected to it, in order to measure the electric resistance over the grounding system, when the at least one movable rod element is in the grounded position.

This may enable an operator to verify the grounding of the high voltage equipment by measuring the electric resistance over the grounding system.

A measured low value of the electric resistance indicates that the grounding is complete, while a measured high electric resistance value indicates that there is a problem with the grounding. Generally, the low electric resistance is in the mO range and the high electric resistance is in the MΩ range or higher.

Electric properties of the grounding with respect to the grounding capability of the grounding system can thus be monitored and verified from a remote location, prior to approaching the high voltage equipment.

Alternatively only one of the first or second control terminals may be installed and the control measurement of the electric resistance measurement may be performed through ground.

In an embodiment the rod propulsion system may be pneumatically and/or hydraulically and/or mechanically operated. This may provide a comparably simple mechanism for moving of the rod element. Thus, as an example, upon operation of the previously discussed control device by an operator, a pneumatic mechanism in communication with the control device is activated, such as a hose transporting fluid to the rod propulsion system comprising a piston responsive to the fluid, which in its turn causes the rod element to move between the ungrounded and grounded position.

It is possible, in a further embodiment, to provide additionally to a pneumatic or hydraulic rod propulsion system a mechanical system so that the electric equipment can also be grounded in case there is a power failure or the like. The mechanical propulsion system may thus be configured to be manually operated but from a safe distance.

The mechanical propulsion system may comprise driving shafts and transmissions with a manual access point for example in the form of a crank. The crank can for example be positioned outside the building, which is housing the electric equipment so that safety is further enhanced.

In an embodiment the at least one conductive section comprises a pipe element made of an electric conductive material. The pipe element may for example be made of metal.

In a further preferred embodiment the isolating section may comprise a spigot element, the spigot element being arranged with at least one end portion partially inserted into the pipe element of the conductive section. The spigot element may comprises two end portions, whereby a diameter of the end portions is chosen so that the end portions snuggly fit into the pipe element and whereby a diameter of a middle portion of the spigot element corresponds substantially to the outer diameter of the pipe element. The spigot element may be glued or alternatively force-fitted into the pipe element via the end portions.

In an embodiment the positive and negative grounding terminals may each comprise a contact element, which is configured to be in contact with the at least one moveable rod element.

The contact element may allow longitudinal movement of the movable rod element but still be strong enough to provide electric contact with the conductive sections, when the moveable rod element is in the grounded position. The contact element may encircle the movable rod element or alternatively be shaped like a clamp or hook that partially encircles the movable rod element.

The contact element may be a contact spring or alternatively a contact brush or even a collector shoe.

Each positive and negative grounding terminal may comprise two contact elements, whereby one of the two contact elements may be arranged close to one end of the grounding terminal and the other of the two spring elements at the other end of the grounding terminal. This way the grounding terminal can achieve the bridging of an isolating section, when the movable rod element is in the grounded position.

In another embodiment the grounding system may comprise a plurality of movable rod elements each comprising a plurality of isolating sections and a plurality of conductive sections, a plurality of pairs of positive and negative grounding terminals and a plurality of conductors The conductors may be configured to electrically connect two consecutive movable rod elements in series.

The grounding system may thus be used for an electric equipment that has a plurality of pairs of negative and positive ground terminals, such as for example for capacitors of cells of a modular multilevel voltage source converter system.

In order to ensure the grounding of the grounding system at least one of the plurality of conductors may be connected to ground.

In an embodiment each of the positive and negative ground terminals electrically interconnects two consecutive conductive sections, when the moveable rod element is in the grounded position.

The lengths of the isolating sections, the conductive sections and the positive and negative grounding terminals respectively the distance between the two contact elements of the positive and/or negative grounding terminals is chosen so that the interconnection of two consecutive conductive sections is achieved when the moveable rod element is in the grounded position.

In a further embodiment the rod propulsion system is a pneumatic or a hydraulic rod propulsion system and comprises a pipe arrangement and at least one propelled piston allocated to each of the moveable rod elements and fluidically interconnected with the pipe arrangement in order to move the moveable rod element from the ungrounded position into a short-circuited position and further into the grounded position and back.

The pipe arrangement may be connected to the propelled piston(s) and the control device so that an operator can activate the grounding system from a remote location.

The grounding system may be installed in a modular multilevel voltage source converter system.

Generally, all terms used in the claims are to be interpreted according to their ordinary meaning in the technical field, unless explicitly defined otherwise herein. All references to "a/an/the element, apparatus, component, means, step, arrangement, portions, etc." are to be interpreted openly as referring to at least one instance of the element, apparatus, component, means, step, arrangement, portions, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which.

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figure 1:
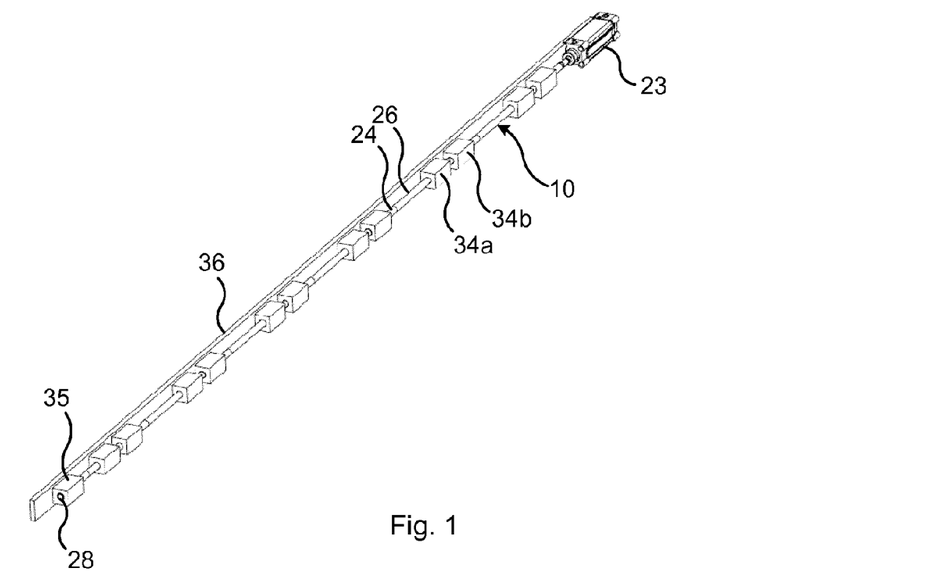
FIG. 1 schematically illustrates a moveable rod element of the grounding system according to the invention.
Figure 11:
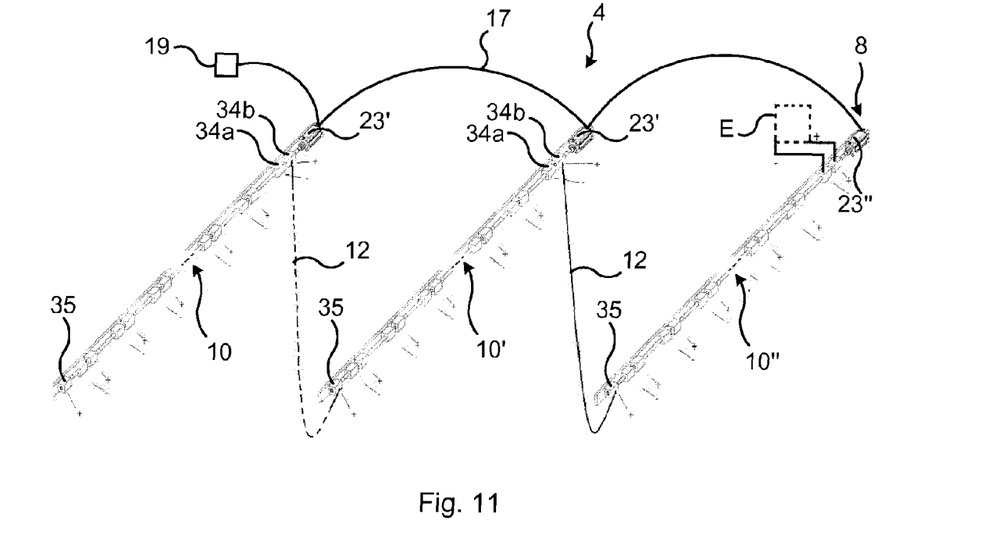
FIG. 11 schematically illustrates the principle of the grounding system according to the invention.

FIG. 1 perspectively illustrates a moveable rod element 10 interacting with a plurality of pairs of positive and negative grounding terminals 34a, 34b of electric equipment such as capacitors of valve cells or the like. One pair of positive and negative grounding terminals 34a, 34b is assigned to the electric equipment such as a capacitor. The moveable rod element 10 comprises a plurality of conductive sections 26 and plurality of isolating sections 24. Each conductive section 26 is followed by an isolating section 24 and vice versa. The moveable rod element 10 is arranged to extend through holes in the positive and negative grounding terminals 34a, 34b and it is moveable along its longitudinal axis by a piston 23. An end terminal 35, arranged at one of the ends of the moveable rod element 10, is shaped similar to the positive and negative grounding terminals 34a, 34b and the end terminal 35 and/or the moveable rod element 10 may comprise an optical indicator 28, which indicates the current position of the moveable rod element 10 to an operator or personnel being in visual distance of the moveable rod element 10. The moveable rod element 10 is configured to be propelled or pushed and pulled by a piston 23. The piston 23 is connected to a rod propulsion system 8 (c.f. FIG. 11).

For illustrative purposes the positive and negative grounding terminals 34a, 34b, the end terminal 35 and the piston 23 are shown to be mounted on a board 36 in FIG. 1. In another embodiment of the invention the positive and negative grounding terminals 34a, 34b, the end terminal 35 and the piston 23 may however be directly connected to the electric equipment. The board 36 is thus not necessary for the functioning of the invention.

Figure 2:
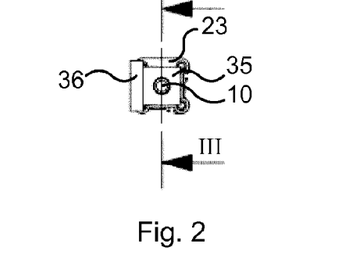
FIG. 2 illustrates a front view onto the moveable rod element of the grounding system according to the invention.

FIG. 2 illustrates a front view onto the end terminal 35, with the piston 23 and the board 36 visible. The moveable rod element 10 is inserted into and extends through holes in the end terminal 35 and holes in the positive and negative grounding terminals 34a, 34b.

Figure 3:
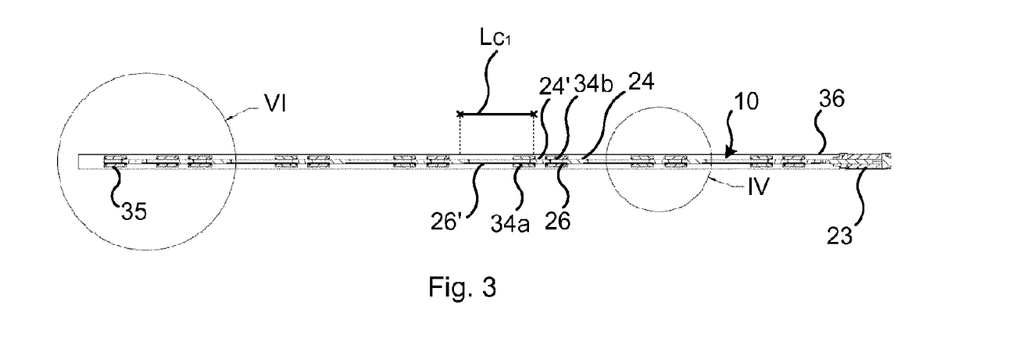
FIG. 3 illustrates a view onto a cross section of the movable rod element cut along line III-III of FIG. 2.

FIG. 3 illustrates a side view onto a cross section cut along line III-III of FIG. 2. From FIG. 3 it can be seen that each isolating section 24 is followed by a conductive section 26, which is followed by a further isolating section 24', which is followed by a further isolating section 26'. Each pair of positive and negative grounding terminal 34a, 34b is assigned to two isolating sections 24, 24' and two conductive sections 26, 26'. The lengths of the isolating sections 24 and the further isolating sections 24' and the lengths of the conductive sections 26 and the further conductive sections 26' are not the same, as will be explained later herein. In FIG. 3 the length Lc1 of the further conductive section 26' is indicated.

In the figures, the moveable rod element 10 is used to ground six pairs of positive and negative grounding terminals 34a, 34b. Each pair of positive and negative grounding terminal 34a, 34b has a group of two isolating sections 24, 24' and two conductive sections 26, 26' assigned to it. Any other number of pairs of positive and negative grounding terminals 34a, 34b may however be chosen. Further the invention may also be achieved by using only one isolating section 24 and one conductive section 26 for each pair of positive and negative grounding terminal 34a, 34b.

Figure 4:
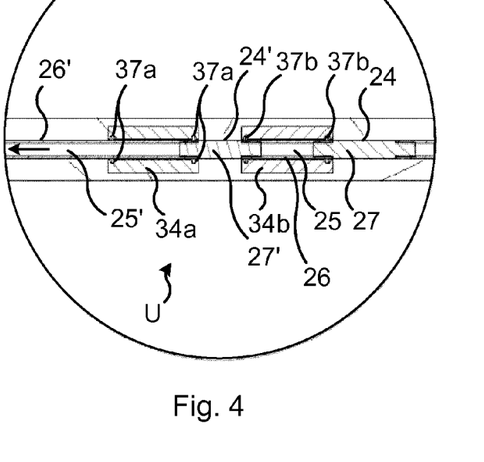
FIG. 4 illustrates an enhanced view of part IV of FIG. 3.

FIG. 4 illustrates an enhanced part IV of FIG. 3. The moveable rod element 10 is in the ungrounded position U in FIG. 4 and thus also in FIGS. 1 to 3. Each of the positive and negative grounding terminals 34a, 34b comprises two contact elements 37a, 37b, which contact elements 37a, 37b are used to establish contact between the moveable rod element 10 and the positive grounding terminal 34a and negative grounding terminal 34b. In the ungrounded position U, the two contact elements 37a of the positive grounding terminal 34a are in electric contact with the further conductive section 26' and the two contact elements 37b of the negative grounding terminal 34 are in electric contact with the conductive section 26. The contact elements 37a, 37b may be embodied in the form of spring elements, contact brushes or contact shoes. The pair of positive and negative grounding terminals 34a, 34b and thus the contact elements 37a of the positive grounding terminal 34a and the contact elements 37b of the negative grounding terminal 34b are electrically separated from each other via the isolating section 24'. The current path is thus not closed along the movable rod element 10 and the all positive and negative grounding terminals 34a, 34b are electrically separated from one another by the isolating sections 24, 24'. When the electric equipment such as the modular multilevel voltage source converter system is in use, the moveable rod element is in the ungrounded position U.

Figure 5:
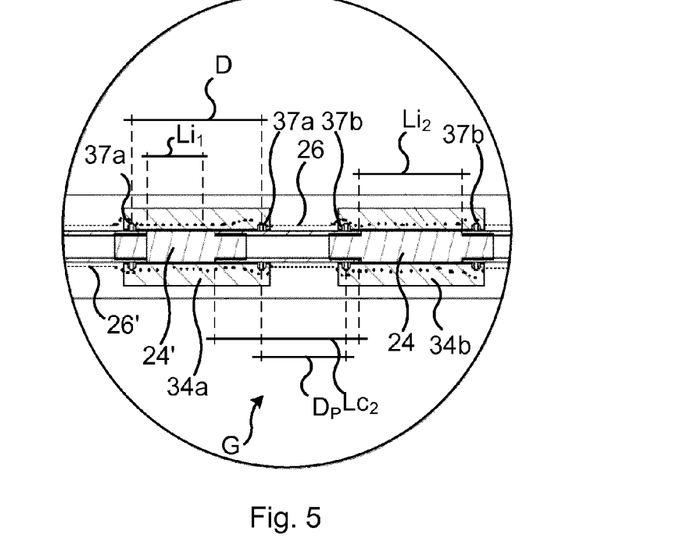
FIG. 5 illustrates a similar view as FIG. 4 with the moveable rod element moved.

The isolating sections 24, 24' are formed by spigot elements 27, 27', which comprise two end portions and a middle portion. The lengths Li1, Li2 (c.f. FIG. 5) of the middle portion corresponds to the lengths of the isolating sections 24, 24', as illustrated in FIG. 4. The end portions of the spigot elements 27, 27' are formed so that they snuggly fit into pipe elements 25, 25', which form the conductive sections 26, 26'. The diameter of the end portions are thus equal or smaller to the inner diameter of the pipe elements 25, 25' and the diameter of the middle portion thus corresponds substantially to the outer diameter of the pipe elements 25, 25'. The pipe elements 25, 25' are preferably made of metal and the spigot elements 27, 27' of an electrically non-conductive material such as plastic, rubber, carbon or the like.

The spigot elements 25, 25' may be glued or force fitted into the pipe elements 27, 27', thereby forming the moveable rod element 10.

When the moveable rod element 10 is moved by the piston 23 along its longitudinal axis from the ungrounded position U into the grounded position G, as illustrated by the arrow in FIG. 4, the current path is closed and all positive and negative grounding terminals 34a, 34b are electrically interconnected with one another, as shown in FIG. 5, which shows a similar view as FIG. 4 but with the moveable rod element 10 moved from the ungrounded position U, shown in FIG. 4. The current can thus flow along the moveable rod element 10 via the conductive sections 26, 26', the contact elements 37a, 37b, the positive grounding terminals 34a and the negative grounding terminals 34b and all charges from the electric equipment may be discharged leaving the electric equipment deenergized. The current path is schematically indicated in FIG. 5 by a dotted line. In order to ground the moveable rod element 10, a conductor 12 or bus bar (c.f. FIG. 11) may be electrically connected to the moveable rod element 10 and to ground.

As previously mentioned, the lengths of the conductive sections 26, 26' and the isolating sections 24, 24' are not the same. In FIG. 5 the lengths Li1 of the further isolating section 24' is shorter than the length Li2 of the isolating section 24 and both lengths Li1, Li2 of the isolating sections are shorter than a distance D between the two contact elements 37a, 37b arranged on the positive grounding terminal 34a and the negative grounding terminal 34b, respectively. A length Lc2 of the conductive section 26 is smaller than a length Lc1 of the further conductive section 26'. The length Lc2 of the conductive section 26 is however chosen to be longer than a smallest distance Dp between a contact element 37a of positive grounding terminal 34a and the contact element 37b of a negative grounding terminal 34b, as shown in FIG. 5. All distances D, Dp and lengths Li1, Li2, Lc1, Lc2 are measured along or parallel the longitudinal axis of the moveable rod element 10.

The above described length-relationships ensure that the moveable rod element 10 can be moved from the ungrounded position U first into a short circuited position (not shown), in which each pair of positive and negative grounding terminals 34a, 34b are in electric contact with each other via the conductive section 26 but the pair of positive and negative grounding terminals 34a, 34b is still not in electric contact with previous and subsequent pairs of positive and negative grounding terminals. In the short circuited position the positive and negative grounding terminals 34a, 34b of a pair of positive and negative grounding terminals 34a, 34b have the same electric potential. From the short circuited position the moveable rod element 10 may be further moved into the grounded position G, as illustrated in FIG. 5. The piston 23 is configured to push and pull the moveable rod element back and forth along the longitudinal axis of the moveable rod element 10. Once the moveable rod element is in the grounded position, personnel may enter into the building where the electric equipment is located and maintenance work may be performed. After the work is done and after the last person has left the building, the moveable rod element 10 may be pulled back from the grounded position G into the short circuited position and from there into the ungrounded position U.

Figure 6:
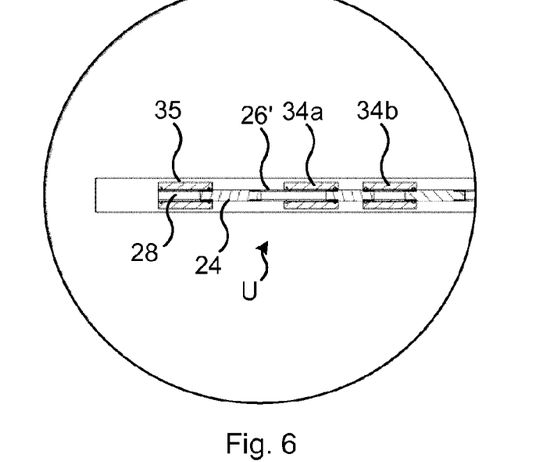
FIG. 6 illustrates an enhanced view of part VI of FIG. 3.

FIG. 6 illustrates enhanced part VI of FIG. 3, showing the end terminal 35. FIG. 6 illustrates the moveable rod element 10 in the ungrounded position U, as the end terminal 35 is electrically separated from the pair of positive and negative grounding terminal 34a, 34b by the isolating section 24. In the grounded positioned G (not shown in FIG. 6) the end terminal 35 forms part of the current path as it is in electric contact with the conductive section 26'. A conductor 12 (c.f. FIG. 11) may be connected to the end terminal 35 in order to ground the moveable rod element 10 or in order to connect the moveable rod element 10 with a further moveable rod element 10' (c.f. FIG. 11). In FIG. 6 is further the colour indicator 28 shown. The colour indicator may visually indicate if the moveable rod element 10 is in the grounded position or not, since it will be visible once the moveable rod element 10 is in the grounded position. In FIG. 6 the colour indicator is hidden within the end terminal and thus not visible to a person. The person thus knows that the electric equipment is in use and not grounded.

Figure 7:
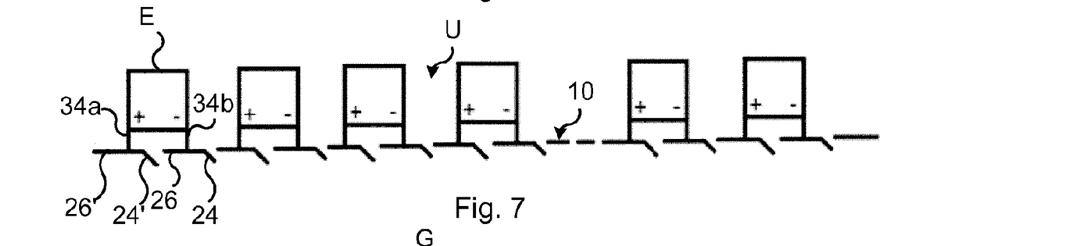
FIG. 7 is a schematic sketch illustrating positive and negative grounding terminals of electric equipment interacting with the moveable rod element of the grounding system.
Figure 8:
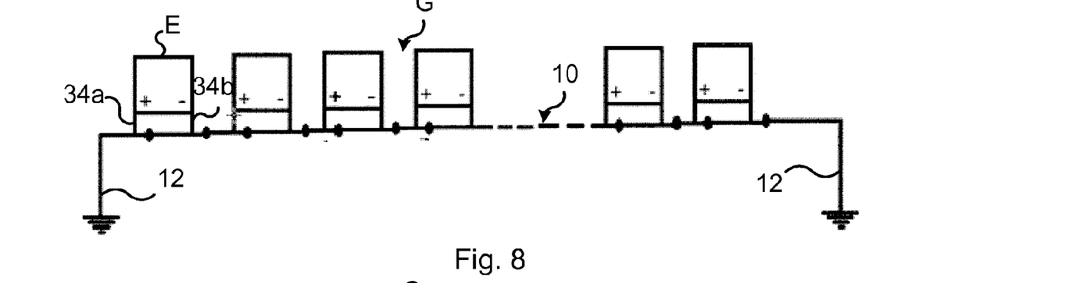
FIG. 8 is a similar schematic sketch as FIG. 7 illustrating the moveable rod element in the grounded position.

FIGS. 7 to 8 illustrate schematically how the moveable rod element 10 functions in combination with electric equipment E.

FIG. 7 shows the moveable rod element 10 schematically with the isolating sections 24, 24' and the conductive sections 26, 26' indicated. In FIG. 7 the moveable rod element 10 is in the ungrounded position U with the isolating sections 24, 24' being illustrated as switches. The positive and negative grounding terminals 34a, 34b are electrically separated by the switches/isolating sections 24, 24'.

FIG. 8 shows the moveable rod element 10 in the grounded position G with the isolating sections 24, 24' (not indicated in FIG. 8) being bridged by the positive and negative grounding terminals 34a, 34b and the moveable rod element 10 being electrically connected to ground by the conductor 12. The conductor 12 may be a bus bar.

Figure 9:
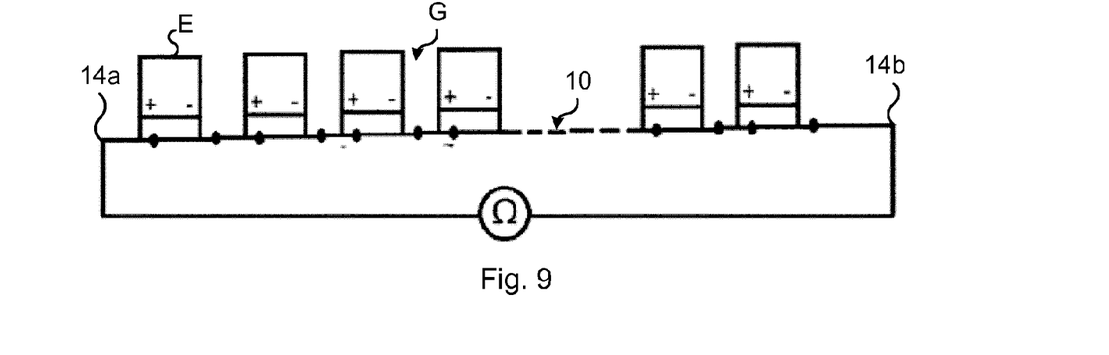
FIG. 9 is again a similar schematic sketch as FIGS. 7 and 8 illustrating how a control measurement is performed.
Figure 10:
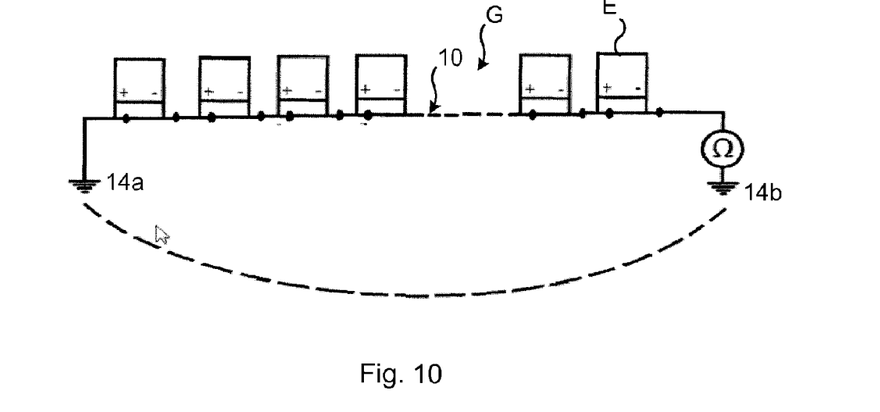
FIG. 10 is a similar schematic sketch as FIG. 9, illustrating a control measurement over ground.

Once the moveable rod element 10 is in the grounded position G a control measurement may be performed via first and second control terminals 14a, 14b, as illustrated in FIGS. 9 and 10. The control measurement may be performed directly over the moveable rod element 10 or over a plurality of moveable rod elements 10, 10' by electrically connecting a control instrument or control measurement device to the first and second control terminals 14a, 14b, as shown in FIG. 9. A low electric resistance in the range of mΩ during the measurement indicates a proper grounding of the electric equipment and an electric resistance in the high MO indicates a problem in the grounding of the electric equipment.

Alternatively to the control measurement shown in FIG. 9, the control measurement may be performed over earth, as shown in FIG. 10.

FIG. 11 illustrates how the moveable rod elements 10, 10', 10" may be installed on various electric equipment or cell layers of a modular multilevel voltage source converter, thereby forming a grounding system 4. The grounding system 4 further comprises a rod propulsion system 8 and the conductors 12 that electrically interconnect the plurality of moveable rod elements 10, 10', 10". The rod propulsion system 8 comprises a pipe arrangement 17, a control device 19 and the pistons 23', 23', 23". The pipe arrangement 17 may comprise various pipes for distributing air pressure or hydraulic pressure depending if the rod propulsion system is pneumatic or hydraulic. The control device 19 may be operated by an operator from a remote location, preferably outside the building where the electric equipment E is located. As illustrated in FIG. 11, the conductors 12 may be electrically connected with to the moveable rod elements 10, 10' via the first negative grounding terminal 34b as seen from the piston 23 and the end terminal 35 of the previous moveable rod element 10.' At least one of the conductors 12 may be connected to ground (not shown in FIG. 11) as previously mentioned.

Figure 12:
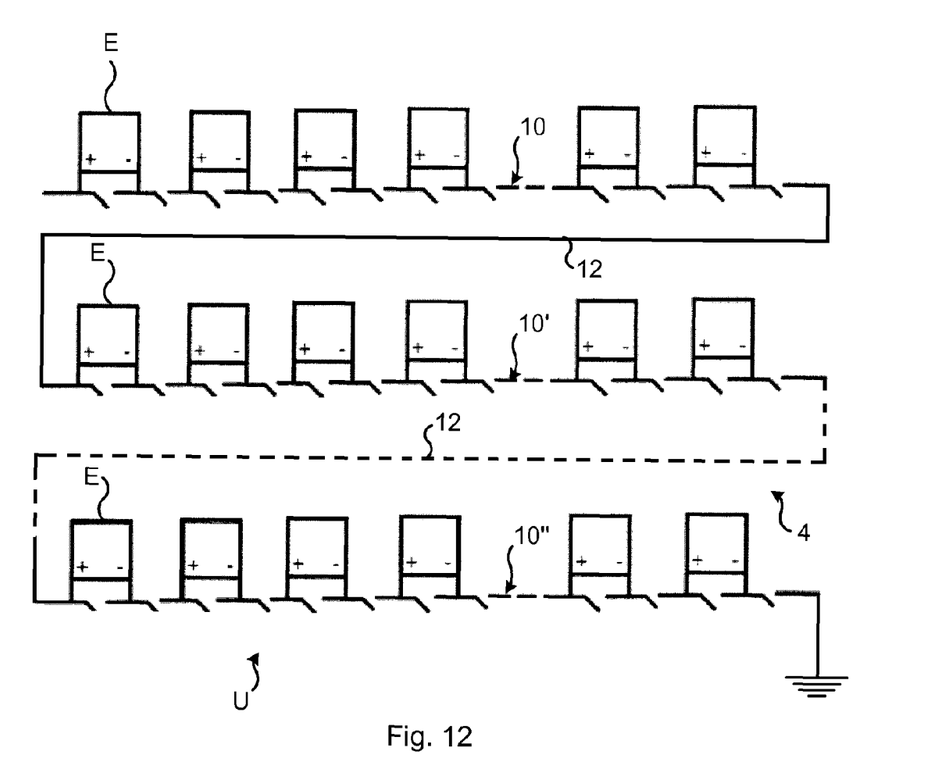
FIG. 12 is a schematic sketch of the grounding system according to the invention installed with electric equipment.

FIG. 12 schematically illustrates an electric scheme of the grounding system 4, when the moveable rod elements 10, 10', 10" are in the ungrounded position U. From FIG. 12 and FIG. 8 it becomes clear that the current path is closed over all the electric equipment E that needs to be grounded, once all the moveable rod elements 10, 10', 10" are in grounded position G (not shown in FIG. 12). This makes the control measurement very convenient, even if the grounding system 4 is installed in rather complex electric equipment E such as modular multilevel voltage source converters (c.f. FIGS. 9, 10 and 12).

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A modular multilevel voltage source converter system comprising high voltage electric equipment to be grounded when not in use and a grounding system, said high voltage electric equipment comprising a modular multilevel voltage source converter having cells with capacitors and a plurality of pairs of positive and negative grounding terminals respectively assigned to the cell capacitors, said grounding system comprising a rod element interacting with said terminals, whereby said rod element comprises at least one conductive section and at least one isolating section;

whereby the grounding system further comprises a rod propulsion system arranged to be remotely controlled and configured to move said rod element along its longitudinal axis in a longitudinal movement from an ungrounded position, in which the positive and negative grounding terminals are isolated from one another by the at least one isolating section, into a grounded position, in which the positive and negative grounding terminals are galvanically connected with one another by the at least one conductive section, and in which in the grounded position the at least one conductive section is connected to ground via an at least one conductor;

whereby the positive and negative grounding terminals each comprise a first contact element and a second contact element, which allow the longitudinal movement of the rod element, and provide electric contact with said at least one conductive section when the rod element is in the grounded position;

whereby respective lengths of the at least one isolating section, the at least one conductive section, and a distance between the first contact element and the second contact element of the positive and/or negative grounding terminals are chosen so that an electrical interconnection of the at least one conductive section to a second consecutive conductive section is achieved when the rod element is in the grounded position, while an electrical isolation of the positive and negative grounding terminals is achieved when the rod element is in the ungrounded position.

2. The modular multilevel voltage source converter system according to claim 1, comprising:
at least first and second control terminals, the first control terminal being arranged at one side of the rod element and the second control terminal being arranged on another side of the rod element, for measuring the resistance over the grounding system, when the rod element is in the grounded position.

3. The modular multilevel voltage source converter system according to claim 2, wherein the rod propulsion system is arranged to be pneumatically and/or hydraulically and/or mechanically operated.

4. The modular multilevel voltage source converter system according to claim 2, wherein the at least one conductive section is formed by a pipe element made of an electric conductive material.

5. The modular multilevel voltage source converter system according to claim 2, comprising:
a plurality of movable rod elements each comprising a plurality of isolating sections and a plurality of conductive sections, a plurality of pairs of positive and negative grounding terminals and a plurality of conductors wherein the conductors are configured to electrically connect two consecutive moveable rod elements in series.

6. The modular multilevel voltage source converter system according to claim 2, wherein the rod propulsion system is a pneumatic or a hydraulic rod propulsion system and comprises a pipe arrangement and at least one propelled piston allocated to the rod element and fluidically interconnected with the pipe arrangement in order to move the rod element from the ungrounded position into a short-circuited position and further into the grounded position and back.

7. The modular multilevel voltage source converter system according to claim 1, wherein the rod propulsion system is arranged to be pneumatically and/or hydraulically and/or mechanically operated.

8. The modular multilevel voltage source converter system according to claim 7, wherein the rod propulsion system being in communication with a control device arranged to control the rod propulsion system upon activation.

9. The modular multilevel voltage source converter system according to claim 7, wherein the at least one conductive section is formed by a pipe element made of an electric conductive material.

10. The modular multilevel voltage source converter system according to claim 7, comprising:
a plurality of movable rod elements each comprising a plurality of isolating sections and a plurality of conductive sections, a plurality of pairs of positive and negative grounding terminals and a plurality of conductors wherein the conductors are configured to electrically connect two consecutive moveable rod elements in series.

11. The modular multilevel voltage source converter system according to claim 7, wherein the rod propulsion system is a pneumatic or a hydraulic rod propulsion system and comprises a pipe arrangement and at least one propelled piston allocated to the rod element and fluidically interconnected with the pipe arrangement in order to move the rod element from the ungrounded position into a short-circuited position and further into the grounded position and back.

12. The modular multilevel voltage source converter system according to claim 1, wherein the rod propulsion system being in communication with a control device arranged to control the rod propulsion system upon activation.

13. The modular multilevel voltage source converter system according to claim 1, wherein the at least one conductive section is formed by a pipe element made of an electric conductive material.

14. The modular multilevel voltage source converter system according to claim 13, wherein the at least one isolating section is formed by a spigot element and wherein the spigot element is arranged with at least one end portion at least partially, preferably fully inserted into the pipe element of the at least one conductive section.

15. The modular multilevel voltage source converter system according to claim 1, comprising:
 a plurality of movable rod elements each comprising a plurality of isolating sections and a plurality of conductive sections, a plurality of pairs of positive and negative grounding terminals and a plurality of conductors wherein the conductors are configured to electrically connect two consecutive moveable rod elements in series.

16. The modular multilevel voltage source converter system according to claim 15, wherein at least one of the plurality of conductors is galvanically connected to ground.

17. The modular multilevel voltage source converter system according to claim 16, wherein each of the positive and negative grounding terminals electrically interconnects two consecutive conductive sections, when the moveable rod element is in the grounded position.

18. The modular multilevel voltage source converter system according to claim 15, wherein each of the positive and negative grounding terminals electrically interconnects two consecutive conductive sections, when the rod element is in the grounded position.

19. The modular multilevel voltage source converter system according to claim 1, wherein the rod propulsion system is a pneumatic or a hydraulic rod propulsion system and comprises a pipe arrangement and at least one propelled piston allocated to the rod element and fluidically interconnected with the pipe arrangement in order to move the rod element from the ungrounded position into a short-circuited position and further into the grounded position and back.

* * * * *